(12) United States Patent  (10) Patent No.: US 7,711,998 B2
Foeste (45) Date of Patent: May 4, 2010

(54) TEST CIRCUIT ARRANGEMENT

(75) Inventor: Bernd Foeste, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 251 days.

(21) Appl. No.: 11/694,012

(22) Filed: Mar. 30, 2007

(65) Prior Publication Data

US 2008/0238437 A1  Oct. 2, 2008

(51) Int. Cl.
*G11C 29/00* (2006.01)

(52) U.S. Cl. .............................. 714/721; 714/5; 714/30; 714/42; 714/718; 714/723; 714/745; 365/201; 711/104

(58) Field of Classification Search ........................ None
See application file for complete search history.

(56) References Cited

U.S. PATENT DOCUMENTS

| | | | | |
|---|---|---|---|---|
| 5,365,475 A * | 11/1994 | Matsumura et al. | ......... | 365/154 |
| 5,646,885 A * | 7/1997 | Matsuo et al. | ......... | 365/185.05 |
| 6,304,505 B1 | 10/2001 | Forbes et al. | | |
| 6,385,081 B1 * | 5/2002 | Shiomi | ....................... | 365/154 |
| 6,552,924 B1 | 4/2003 | Brooks et al. | | |
| 6,882,007 B2 * | 4/2005 | Landgraf et al. | ............. | 257/329 |
| 6,934,200 B2 | 8/2005 | Bhat et al. | | |
| 7,042,249 B2 * | 5/2006 | Jankowski et al. | ............ | 326/83 |
| 7,292,481 B2 * | 11/2007 | Takeda | ................... | 365/189.05 |
| 7,313,049 B2 * | 12/2007 | Huang | .................... | 365/230.05 |
| 7,480,882 B1 * | 1/2009 | Song et al. | ...................... | 716/6 |
| 2002/0018381 A1 * | 2/2002 | Beigel et al. | ................. | 365/201 |
| 2003/0120451 A1 * | 6/2003 | Thatcher et al. | ............. | 702/119 |
| 2004/0098644 A1 * | 5/2004 | Wuu et al. | ................... | 714/723 |
| 2006/0044903 A1 | 3/2006 | Forbes | | |
| 2007/0002617 A1 * | 1/2007 | Houston et al. | ......... | 365/185.07 |

OTHER PUBLICATIONS

A. Rubio et al.; "Class of undetectable stuck-open branches in CMOS memory elements"; Circuits, Devices and Systems IEE Proceedings-G, vol. 139, No. 4, Aug. 1992, pp. 503-506.

M. Reddy et al.; "Detecting FET Stuck-Open Faults in CMOS Latches and Flip-Flops"; IEEE Design & Test of Computers, vol. 3, No. 5, Oct. 1986, pp. 17-26.

* cited by examiner

*Primary Examiner*—John P Trimmings
(74) *Attorney, Agent, or Firm*—Dickstein, Shapiro, LLP.

(57) ABSTRACT

A test circuit arrangement for testing latch units is provided which includes a) a voltage generator configured to adjust a voltage potential difference between a first ground line and a second ground line of the latch units and/or to adjust a voltage potential difference between a first supply voltage line and a second supply voltage line of the latch units; b) combiner configured to combine logical outputs of the latch units; and c) determiner configured to determine the voltage potential difference between the first ground line and the second ground line and/or the voltage potential difference between the first supply voltage line and the second supply voltage line in a state when all of the latch units have identical logical outputs.

19 Claims, 4 Drawing Sheets

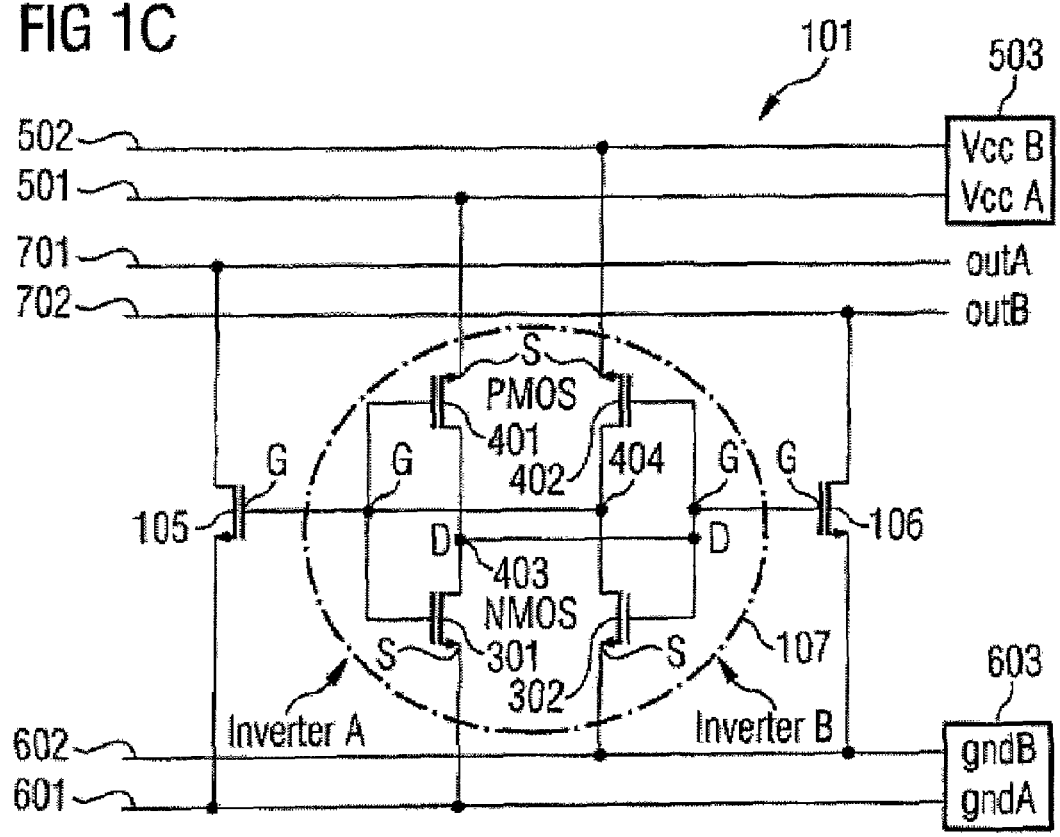

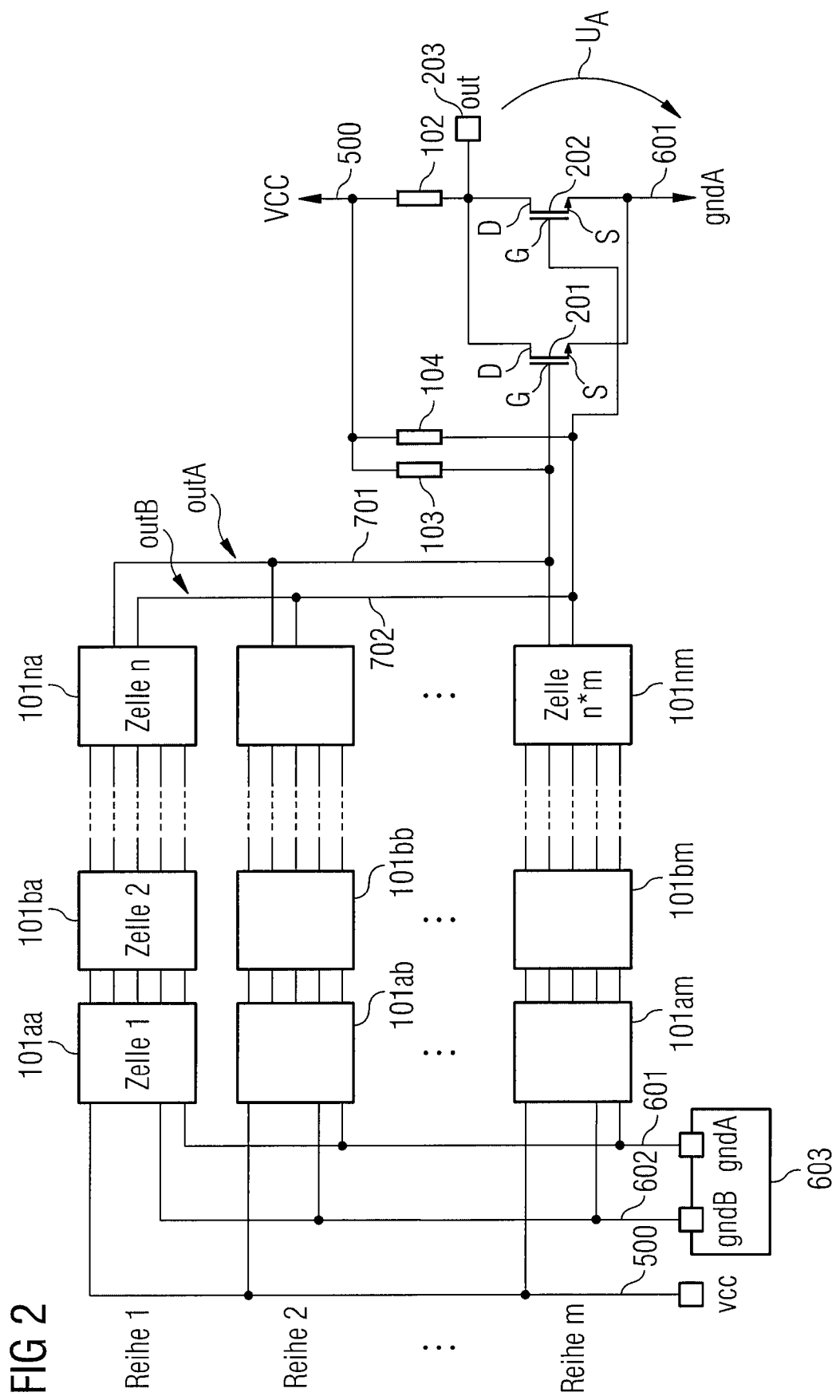

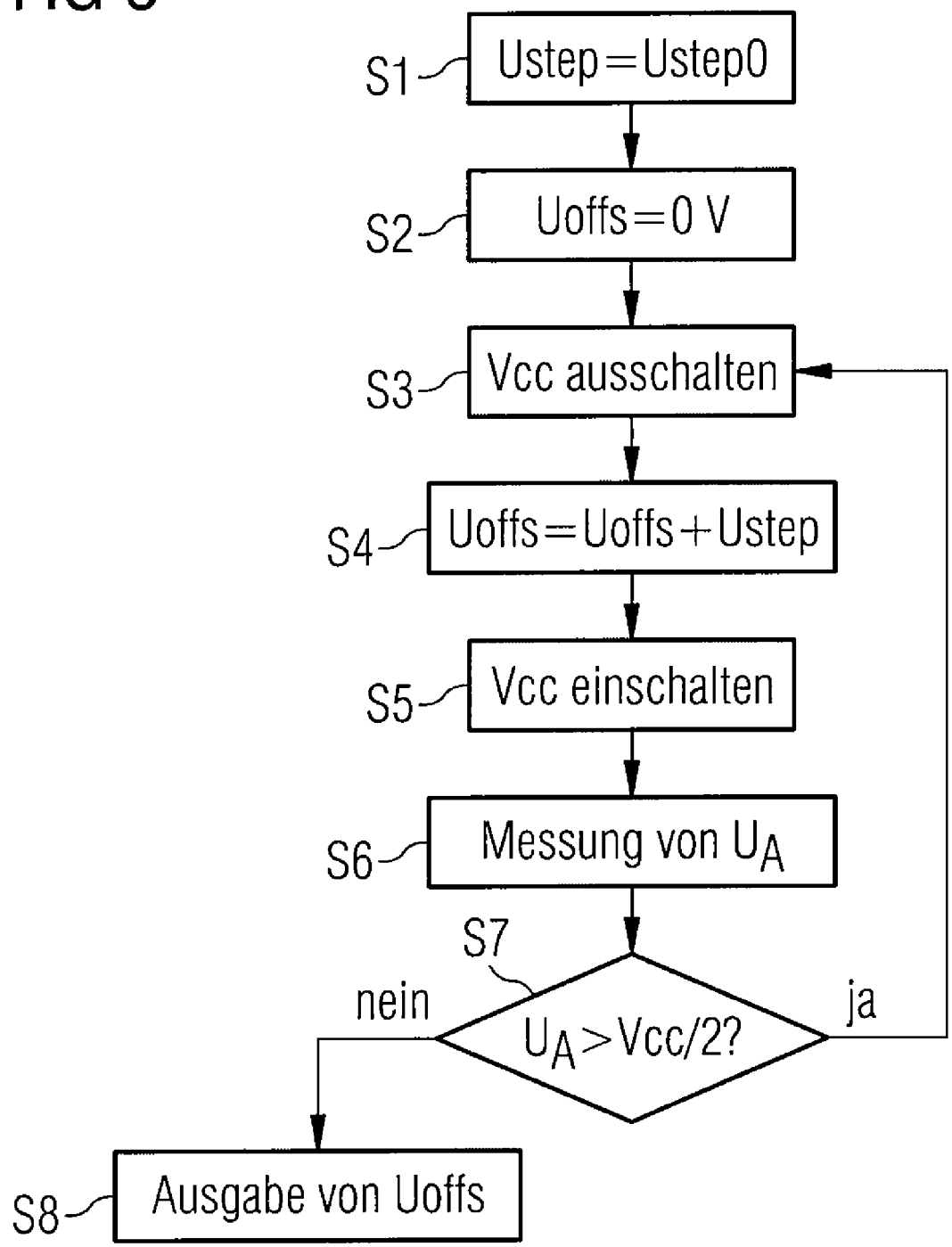

TEST CIRCUIT ARRANGEMENT

BACKGROUND

The present invention relates to a test circuit arrangement. The present invention can be applied to the detection of write/read errors in SRAM devices (SRAM, S-random access memories). The present invention in particular relates to latch units consisting of N-type transistors and P-type transistors, e.g. NMOS and PMOS transistors or NPN and PNP bipolar transistors.

Latch units are used in various circuit arrangements. For example, the core of a SRAM cell comprises latch units in order to store the desired information. In order to guarantee the functionality of latch units it is essential to perform reliable tests that can be used in an efficient manner.

SUMMARY

The present invention provides a test circuit arrangement and a test method for testing the functionality of latch units.

Further preferred aspects of the present invention are according to the sub-claims.

The inventive test circuit arrangement for latch units comprises:
  a) voltage generator configured to adjust a voltage potential difference between a first ground line and a second ground line and/or to adjust a voltage potential difference between a first supply voltage line and a second supply voltage line of the latch unit;
  b) combiner configured to combine logical outputs of the latch units; and
  c) determiner configured to determine the voltage potential difference between the first ground line and the second ground line and/or the voltage potential difference between the first supply voltage line and the second supply voltage line in a state when all of the latch units have switched to identical logical outputs.

According to a further aspect of the present invention a method for testing latch units is designed. The method comprises:
  a1) adjusting a voltage potential difference between the first ground line and the second ground line; and/or
  a2) adjusting a voltage potential difference between the first supply voltage line and the second supply voltage line;
  b) combining logical outputs of the latch units; and
  c) determining the voltage potential difference between the first ground line and the second ground line and/or the voltage potential difference between the first supply voltage line and the second supply voltage line in a state when all of the latch units have identical logical outputs.

DRAWINGS

Embodiments of the present invention are depicted in the drawings and are detailed in the description which follows.

In the drawings:

FIG. 1(c) is a circuit diagram of a latch unit having a ground potential generator for providing a voltage potential difference between first and second ground lines, and also having a supply potential generator for adjusting a voltage potential difference between a first supply voltage line and a second supply voltage line according to another preferred embodiment of the present invention;

FIG. 2 is a block diagram of a cell array for testing a large number of latch units in a test circuit arrangement according to a preferred embodiment of the present invention; and FIG. 3 a flow chart illustrating a method for testing transistor matching using latch units shown in FIG. 1(a) and/or FIG. 1(b), according to a preferred embodiment of the present invention.

In the figures same reference numerals denote the same or similar parts or steps.

DESCRIPTION

Figure 1A:
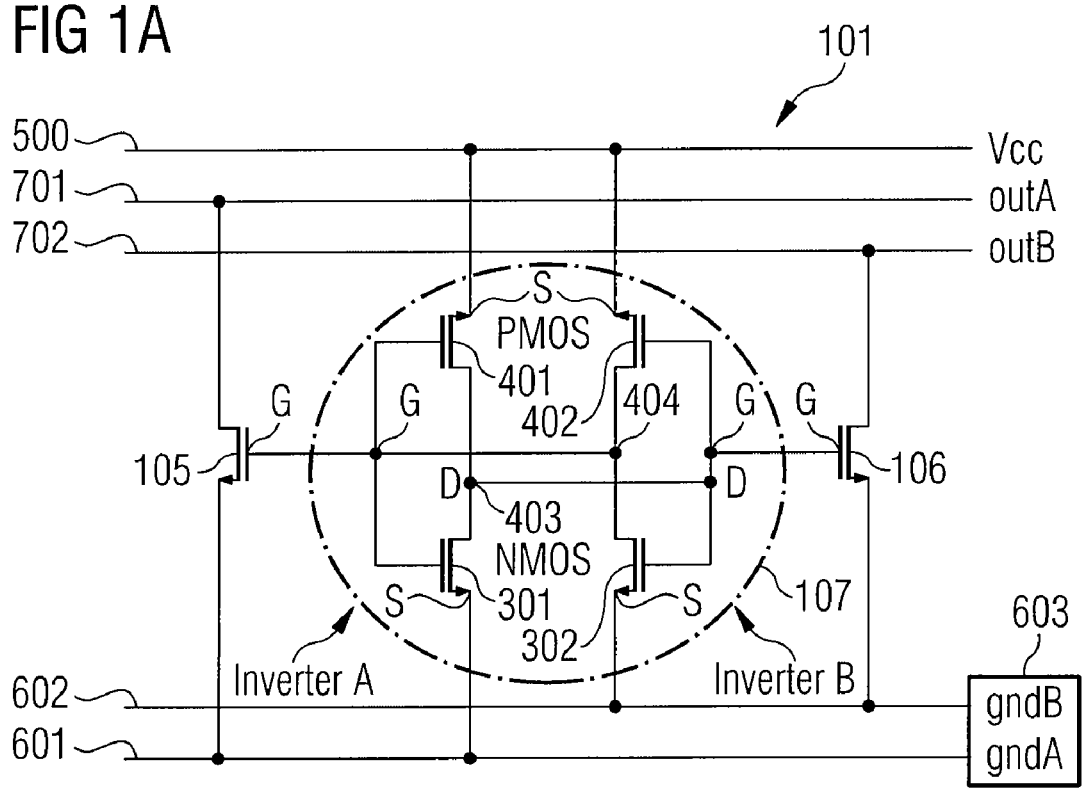
FIG. 1(a) is a circuit diagram of a latch unit having a ground potential generator for providing a voltage potential difference between first and second ground lines according to a first embodiment of the present invention.

A typical latch unit consists of at least two pairs of transistors, i.e. a first pair of N-type transistors including a first N-type transistor and a second N-type transistor and a second pair of P-type transistors including a first P-type and a second P-type transistor.

A first inverter is formed by connecting the gates of the first N-type transistor and the first P-type transistor and by connecting the first N-type transistor and the second P-type transistor in series between a supply voltage line and a ground line (ground).

A second inverter is formed by connecting the gates of the second N-type transistor and the second P-type transistor and by connecting the second N-type transistor and the second P-type transistor in series between the supply voltage line and the ground line.

In order to form a latch circuit, i.e. a so called flip flop circuit arrangement, the junction point between the first N-type transistor and the first P-type transistor is connected to the gates of the second N-type transistor and the second P-type transistor, the gates of which are connected. Furthermore the junction point between the second N-type transistor and the second P-type transistor is connected to the gates of the first N-type transistor and the first P-type transistor which are connected to each other, too. Thus a flip flop arrangement is formed symmetrically.

After turning on the supply voltage, however, i.e. by applying a voltage potential difference between the supply voltage line and the ground line, a logical output state of the latch unit is not defined, i.e. the logical output state of the latch unit can be logical "1" or logical "0". The state after turning on the latch unit depends on random asymmetries in the internal circuit structure. The main source of such asymmetries is a mismatching in a pair of transistors. Such pairs of transistors are in the latch unit a first pair of N-type transistors including a first N-type transistor and a second N-type transistor and a second pair of P-type transistors including a first P-type transistor and a second P-type transistor.

If such kind of mismatching is too large, write/read errors in such kind of circuits occur. There are technological reasons which are responsible for the effect that matching worsens when the circuit size (transistor size) is reduced.

For the improvement of a technological process it is important to know the amount of transistor mismatching in advance. In order to obtain a statistical value the number of tested transistors (transistor pairs) should be as large as possible.

Functionality tests and parameter measurement processes have been proposed to address transistor matching. Functionality tests of SRAM units which contain latch units, however, disadvantageously do not provide any conclusion with respect to error sources and mechanisms. Furthermore, the measurement of electrical parameters of single transistors in a SRAM environment cannot provide a statistical basis for characteristic parameters of latch units.

An advantage of the present invention is the possibility of a statistical measurement for detection of transistor matching of transistor pairs in latch units. Such a statistical measurement can be obtained by testing a large number of latch units in parallel. Logical output states of the latch units are detected and combined by a combination means such as a NOR gate.

In order to detect transistor mismatching the supply voltage lines and/or the ground lines of latch units have been modified in such a way that it is possible to independently change a supply voltage potential and/or a ground potential of a first inverter and a second inverter which form a latch unit.

To this end a ground potential generator is provided for adjusting a voltage potential difference between a first ground line and a second ground line. Additionally or alternatively a supply potential generator is provided for adjusting a voltage potential difference between a first supply voltage line and a second supply voltage line.

As a matching test structure preferably the core of a SRAM cell comprising a flip flop circuit arrangement consisting of two inverters is used.

A preferred embodiment of the inventive latch unit comprises a first pair of N-type transistors including a first N-type transistor and a second N-type transistor and a second pair of P-type transistors including a first P-type transistor and second P-type transistor. The first N-type transistor and the first P-type transistor are connected in series between a supply voltage line and a first ground line. The gates of the first N-type transistor and the first P-type transistor are connected to each other.

The second N-type transistor and the second P-type are connected in series between the supply voltage line and a second ground line which is different from the first ground line and electrically isolated from the first ground line. The gates of the second N-type transistor and the second P-type transistor are connected to each other.

A junction point between the first N-type transistor and the first P-type transistor is connected to the gates of the second N-type transistor and the second P-type transistor, wherein a junction point between the second N-type transistor and the second P-type transistor is connected to the gates of the first N-type transistor and the first P-type transistor.

Advantageously the latch unit comprises first and second output drivers for driving first and second output lines.

According to a further preferred embodiment of the present invention the latch unit comprises a first pair of N-type transistors including a first N-type transistor and a second N-type transistor and a second pair of P-type transistors including a first P-type transistor and a second P-type transistor.

The first N-type transistor and the first P-type transistor, the gates of which are connected, are connected in series between a first supply voltage line and a ground line, wherein the second N-type and the second P-type transistor, the gates of which are connected, are connected in series between a second supply voltage line and the ground line.

The junction point between the first N-type transistor and the first P-type transistor is connected to the gates of the second N-type transistor and the second P-type transistor, wherein the junction point between the second N-type transistor and the second P-type transistor is connected to the gates of the first N-type transistor and the first P-type transistor.

According to the second preferred embodiment of the present invention a supply potential generator is provided for adjusting a voltage potential difference between the first supply voltage line and the second supply voltage line. It is an advantage that the latch unit comprises first and second output drivers for driving first and second output lines.

According to yet a further preferred embodiment of the present invention the latch unit comprises a first pair of N-type transistors including a first N-type transistor and a second N-type transistor and a second pair of P-type transistors including a first P-type transistor and a second P-type transistor. The first N-type transistor and the first P-type transistor, the gates of which are connected to each other, are connected in series between a first supply voltage line and first ground line, wherein the second N-type transistor and the second P-type transistor, the gates of which are connected to each other, are connected in series between a second supply voltage line and a second ground line.

The junction point between the first N-type transistor and first P-type transistor is connected to the gates of the second N-type transistor and the second P-type transistor and the junction point between the second N-type transistor and the second P-type transistor is connected to the gates of the first N-type transistor and the first P-type transistor.

According to this embodiment of the present invention a ground potential generator is provided for adjusting a voltage potential difference between the first ground line and the second ground line and a supply voltage generator is provided for adjusting a voltage potential difference between the first supply voltage line and the second supply voltage line. It is an advantage that the latch unit comprises first and second output drivers for driving first and second output lines.

FIG. 1(a) is a circuit diagram of a latch unit which is designed according to a preferred embodiment of the present invention. The latch unit has a latch core 107 consisting of four MOS transistors, i.e. a first pair of N-type transistors including a first N-type transistor 301 and a second N-type transistor 302, and a second pair of P-type transistors including a first P-type transistor 401 and a second P-type transistor 402. The first N-type transistor 301 and the first P-type transistor 401 are connected in series between a supply voltage line 500 and a first ground line 601. The gates G of the first N-type transistor 301 and the first P-type transistor 401 are connected to each other.

The first N-type transistor 301 and the first P-type transistor 401 are connected with their drains D, wherein the sources S are connected to the supply voltage line 500 and the first ground line 601, respectively.

The first N-type transistor 301 and the first P-type transistor 401 form a first inverter, i.e. an inverter A. A second inverter, i.e. an inverter B is formed by the second N-type transistor and the second P-type transistor, the gates G of which are connected to each other. The second N-type transistor 302 and the second P-type transistor 402 are connected in series between the supply voltage line 500 and a second ground line 602.

A junction point 403 between the first N-type transistor 301 and the first P-type transistor 401 is connected to the gates G of the second N-type transistor 302 and the second P-type transistor 402. Furthermore a junction point 404 between the second N-type transistor 302 and the second P-type transistor 402 is connected to the gates G of the first N-type transistor 301 and the first P-type transistor 401.

The junction point 404 is connected to the gate G of a first output driver 105 which drives the output of a first output line 701, wherein the junction point 403 is connected to the gate G of a second output driver 106 which drives the output at a second output line 702 (outA and outB, respectively).

The latch unit 101 shown in FIG. 1(a) comprises a ground potential generator 603 which is capable of providing different ground potentials (gndA, gndB for inverter A and inverter B respectively).

The adjustment of the voltage potential difference between the first ground line 601 and the second ground line 602 is described with respect to FIG. 3 below.

Figure 1B:
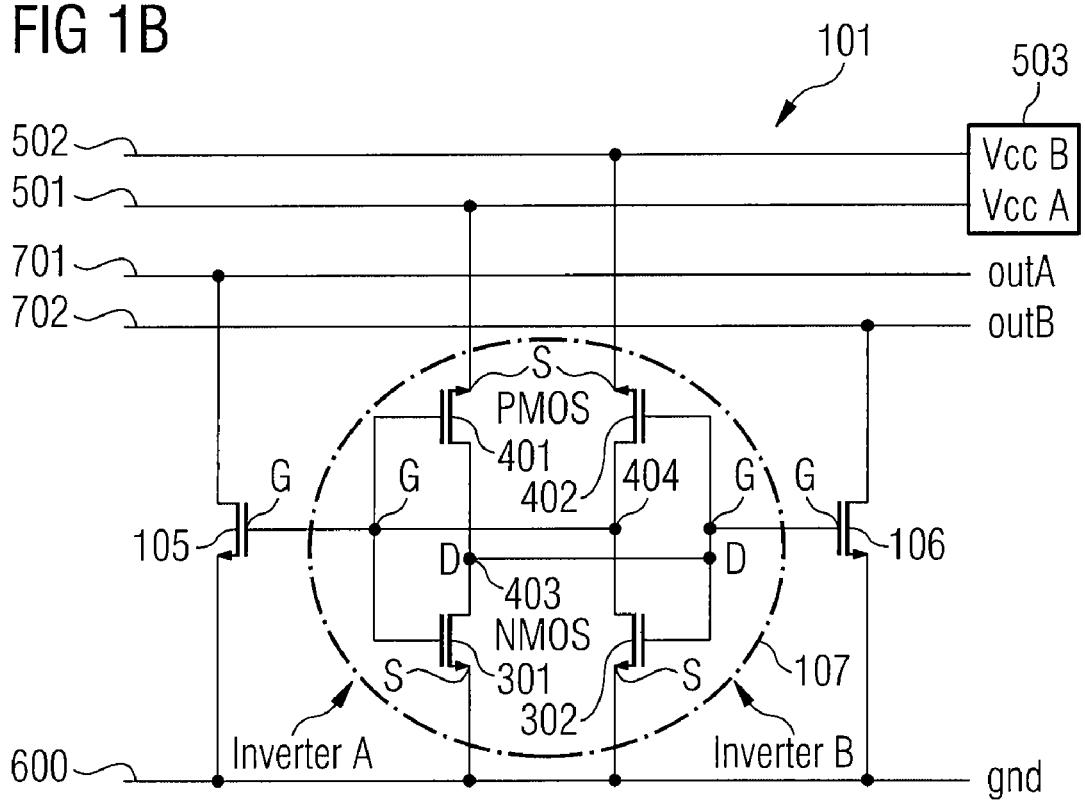
FIG. 1(b) is a circuit diagram of a latch unit having a supply potential generator for adjusting a voltage potential difference between a first supply voltage line and a second supply voltage line according to yet another preferred embodiment of the present invention.

FIG. 1(b) illustrates another latch unit 101 according to a further preferred embodiment of the present invention. In contrast to the circuit arrangement shown in FIG. 1(a) the latch unit shown in FIG. 1(b) has a first N-type transistor and a first P-type transistor, the gates G of which are connected, connected in series via a junction point 403 between a first supply voltage line 501 and a ground line 600. On the other hand the second N-type transistor 302 and the second P-type transistor 402, the gates G of which are connected, are connected in the areas via a junction point 404 between a second supply voltage line 502 and the ground line 600.

The junction point 403 between the first N-type transistor 301 and the first P-type transistor 401 is connected to the gates G of the second N-type transistor 302 and the second P-type transistor 402. The junction point 404 between the second N-type transistor 302 and the second P-type transistor 402 is connected to the gates G of the first N-type transistor 301 and the first P-type transistor 401.

A supply voltage generator 503 is provided for adjusting a voltage potential difference between the first supply voltage line 501 and the second supply voltage line 502. In this case the potential of the ground line 600 (gnd) cannot be varied.

The latch units 101 shown in FIG. 1(a) and FIG. 1(b) assume a certain logical state when supply voltage and ground potential is applied. If perfect transistor matching is realized and a large number of latch units 101 are connected to the supply voltage line 500, 501, 502 and the ground lines 600, 601, 602 without any voltage potential difference between the first supply voltage line 501 and the second supply voltage line 502 on one hand and the first ground line 601 and the second ground line 602 on the other hand, 50% of the latch units 101 will be in an "on" state wherein the other 50% of the latch units will be in an "off" state.

In the present example the "on" state is indicated by a logical "1" value of the first output line 701, i.e. the output outA=1, wherein the logical output at the second output line 702 is "0", i.e. outB=0. Hereinafter this state is called the "on" state.

In order to test a large number of latch units 101 in parallel the logical states at the output lines, i.e. at the first output line 701 or at the second output line 702 are combined by a NOR function such that the resulting outputs are either (outA=0 and outB=1) or (outA=1 and outB=0) if all latch units (cells, see FIG. 2 below) have the same logical state. Using the ground potential generator 603 according to FIG. 1(a) and/or the supply potential generator 503 according to FIG. 1(b) it is possible to force the latch units connected in parallel to switch into a certain logical state which is the same for all latch units 101 connected in parallel.

FIG. 1(c) is a circuit diagram of a latch unit having a ground potential generator for providing a voltage potential difference between first and second ground lines, and also having a supply potential generator for adjusting a voltage potential difference between a first supply voltage line and a second supply voltage line according to another preferred embodiment of the present invention. Since all of the elements of this figure has been described above with respect to FIGS. 1(a) and 1(b), for the sake of brevity a detailed description will not be provided here.

FIG. 2 is a block diagram of a test circuit arrangement for testing a large number of latch units 101aa-101nm. The latch units 101aa-101nm are arranged in a number of m rows and n columns. In the embodiment of the test circuit arrangement shown in FIG. 2 a ground potential generator 603 is provided in order to be able to adjust a voltage potential difference between the first ground line 601 and the second ground line 602.

It is noted that this ground line arrangement corresponds to the circuit configuration shown in FIG. 1(a) whereas it is also possible to use the circuit arrangement of FIG. 1(b) and to provide a supply potential generator for providing a voltage potential difference between the first supply voltage line 501 and the second supply voltage line 502 (see FIG. 1(b)).

Furthermore it is possible to provide both a voltage potential difference between the first ground line 601 and the second ground line 602 by using the ground potential generator 603 and a voltage potential difference between the first supply voltage line 501 and the second supply voltage line 502 by using the supply potential generator 503.

For simplicity of explanation FIG. 2 only shows the application of a voltage potential difference between the first ground line 601 and the second ground line 602. The method for determining a degree of transistor mismatching according to the inventive test method is described with reference to FIG. 3 hereinafter.

As shown in FIG. 2 rows 1 to m of cells 1 to n are connected in parallel wherein the output lines, i.e. the first output line 701 and the second output line 702 are connected to each other via NOR connections. By varying a voltage potential difference between the first ground line 601 and the second ground line 602 using the ground potential generator 603 it is possible to change the output state of individual latch units 101aa-101nm. Thereby, the supply voltage is temporarily switched off, so that a change in the voltage potential difference between the first ground line 601 and the second ground line 602 leads to a change of the state of the cells after the supply voltage has been turned on again. At a certain voltage potential difference between the first ground line 601 and the second ground line 602 all latch units 101aa-101nm are in a defined and same logical state.

The applied voltage potential difference between the first ground line 601 and the second ground line 602 is a measure of the largest degree of transistor mismatching of a latch unit 101. In this way it is possible to test a large number of latch units 101 (typically in the order of 1000) and to obtain a measure for a transistor mismatching of a technological process.

Because it is possible to vary the voltage potential difference between the first ground line 601 and the second ground line 602 in two directions, i.e. gnd>gndB and gnd<gndB, the output lines of the cell array shown in FIG. 2 are connected to a further NOR gate consisting of the first logical output state detection device 201 and the second logical output state detection device 202 consisting of transistors, respectively. Resistors 102, 103 and 104 are provided between the supply voltage line 500 and the gates G (resistor 103 and resistor 104 and the drains D (resistor 102) of the first and second logical output state detection devices 201 and 202, respectively.

The sources S of the first and second logical output state detection devices 201, 202 are connected to the first ground line 601, i.e. gndA.

The test result is output via a main output unit 203. The NOR gate device consisting of the first logical output state detection device 201 and the second logical output state detection device 202 provides a logical "0" output at the main output unit 203 only if all cells, i.e. all latch units 100aa-100nm are in the same logical state, i.e. "0" or "1". In this way the voltage potential difference between the first ground line 601 and the second ground line 602 is a measure for transistor mismatching in the worst case.

FIG. 3 is a flow chart illustrating the test method for testing transistor matching according to a preferred embodiment of the present invention.

It is noted that, in order to obtain a measure for transistor mismatching, the whole circuit arrangement (test circuit arrangement according to FIG. 2) is turned on and off while the state of the latch units is tested in the "on" state.

In step S1 a voltage Ustep is set to a initial value Ustep0. The operation according to the inventive test method proceeds to step S2 where the offset voltage between the first ground line 601 and the second ground line 602 (see FIG. 1(a) and FIG. 2) or between the first supply voltage line 501 and the second supply voltage line 502 (see FIG. 1(b), cell array with latch units not shown) is set to 0V.

The operation proceeds to step S3 where the supply voltage Vcc at the supply voltage line 500 is switched off. In the following step S4 the offset voltage Uoffs is increased by a voltage step Ustep defined in step S1 explained above.

The operation proceeds to step S5 where the supply voltage at the supply voltage line 500 is switched on (Vcc:turn on). The output voltage at the main output unit 203 (see FIG. 2) is measured in a following step S6.

In a following step S7 it is determined, whether the output voltage $U_A$ at the main output unit 203 is larger than Vcc/2 or not. If the output voltage $U_A$ is larger than Vcc/2 ("yes" at step 7), the operation proceeds to step S3 where the supply voltage Vcc is turned off again. Then steps S4, S5 and S6 are repeated, i.e. the offset voltage Uoffs is increased by the step voltage Ustepu. If all latch units 101 are switched to the same logical state, the output voltage $U_A$ at the main output unit 203 is logical "0", i.e. $U_A$<Vcc/2, i.e. "no" at step S7.

Now the offset voltage Uoffs for the worst case transistor matching is obtained and the operation proceeds to final step S8 where the present offset voltage Uoffs is output and the operation is ended. It is noted that the procedure according to FIG. 3 is carried out for both polarities of Uoffs, i.e. for the situation where voltage potential of the first ground line 601 is larger than the voltage potential of the second ground line 602 and for the situation where the voltage potential of the second ground line 602 is larger than the potential of the first ground line 601.

Thus as a measure for transistor mismatching the absolute value of the larger voltage potential difference is taken.

What is claimed is:

1. A test circuit arrangement for testing latch units, comprising:
   a) a voltage generator configured to at least one of:
      a1) adjust a voltage potential difference between a first ground line and a second ground line of the latch units; and
      a2) adjust a voltage potential difference between a first supply voltage line and a second supply voltage line of the latch units;
   b) combiner configured to combine logical outputs of the latch units; and
   c) determiner configured to determine at least one of:
      c1) the voltage potential difference between the first ground line and the second ground line; and
      c2) the voltage potential difference between the first supply voltage line and the second supply voltage line in a state when all of the latch units have identical logical outputs.

2. The test circuit according to claim 1, wherein the combiner is configured of a NOR gate.

3. The test circuit according to claim 1, wherein the latch units each comprise a first pair of N-type transistors including a first N-type transistor and a second N-type transistor and a second pair of P-type transistors including a first P-type transistor and a second P-type transistor.

4. The test circuit according to claim 3, wherein the junction point between the first N-type transistor and the first P-type transistor is connected to the gates of the second N-type transistor and the second P-type transistor and the junction point between the second N-type transistor and the second P-type transistor is connected to the gates of the first N-type transistor and the first P-type transistor.

5. The test circuit according to claim 3, wherein the first N-type transistor and the first P-type transistor, the gates of which are connected, are connected in series via a junction point between a supply voltage line and the first ground line and the second N-type transistor and the second P-type transistor, the gates of which are connected, are connected in series via a junction point between the supply voltage line and the second ground line.

6. The test circuit according to claim 3, wherein the first N-type transistor and the first P-type transistor, the gates of which are connected, are connected in series via a junction point between the first supply voltage line and a ground line and the second N-type transistor and the second P-type transistor, the gates of which are connected, are connected in series via a junction point between the second supply voltage line and the ground line.

7. The test circuit according to claim 3, wherein the first N-type transistor and the first P-type transistor, the gates of which are connected, are connected in series via a junction point between the first supply voltage line and the first ground line and the second N-type transistor and the second P-type transistor, the gates of which are connected, are connected in series via a junction point between the second supply voltage line and the second ground line.

8. The test circuit according to claim 1, wherein the latch units are arranged in a matrix.

9. The test circuit according to claim 1, wherein the test circuit is used for testing transistor matching of at least one pair of transistors of a latch unit.

10. A method for testing latch units, the method comprising:
   a) adjusting at least one of:
      a1) a voltage potential difference between a first ground line and a second ground line; and
      a2) a voltage potential difference between a first supply voltage line and a second supply voltage line;
   b) combining logical outputs of the latch units; and
   c) determining at least one of:
      c1) the voltage potential difference between the first ground line and the second ground line; and
      c2) the voltage potential difference between the first supply voltage line and the second supply voltage line in a state when all of the latch units have identical logical outputs.

11. The method according to claim 10, wherein logical outputs of the latch units are combined using a NOR gate.

12. The method according to claim 10, wherein the method is used for testing transistor matching of at least one pair of transistors of a latch unit.

13. A latch unit, comprising:
a) a first pair of N-type transistors including a first N-type transistor and a second N-type transistor;
b) a second pair of P-type transistors including a first P-type transistor and a second P-type transistor;
wherein:
c) the first N-type transistor and the first P-type transistor, the gates of which are connected, are connected in series via a junction point between a supply voltage line and a first ground line;
d) the second N-type transistor and the second P-type transistor, the gates of which are connected, are connected in series via a junction point between the supply voltage line and a second ground line;
e) the junction point between the first N-type transistor and the first P-type transistor is connected to the gates of the second N-type transistor and the second P-type transistor; and
f) the junction point between the second N-type transistor and the second P-type transistor is connected to the gates of the first N-type transistor and the first P-type transistor; and
g) a ground potential generator configured to adjust a voltage potential difference between the first ground line and the second ground line.

14. The latch unit according to claim 13, wherein the latch unit comprises first and second output drivers configured to drive first and second output lines.

15. A latch unit, comprising:
a) a first pair of N-type transistors including a first N-type transistor and a second N-type transistor;
b) a second pair of P-type transistors including a first P-type transistor and a second P-type transistor;
wherein:
c) the first N-type transistor and the first P-type transistor, the gates of which are connected, are connected in series via a junction point between a first supply voltage line and a ground line;
d) the second N-type transistor and the second P-type transistor, the gates of which are connected, are connected in series via a junction point between a second supply voltage line and the ground line;
e) the junction point between the first N-type transistor and the first P-type transistor is connected to the gates of the second N-type transistor and the second P-type transistor; and
f) the junction point between the second N-type transistor and the second P-type transistor is connected to the gates of the first N-type transistor and the first P-type transistor; and
g) a supply potential generator configured to adjust a voltage potential difference between the first supply voltage line and the second supply voltage line.

16. The latch unit according to claim 15, wherein the latch unit comprises first and second output drivers configured to drive first and second output lines.

17. A latch unit, comprising:
a) a first pair of N-type transistors including a first N-type transistor and a second N-type transistor;
b) a second pair of P-type transistors including a first P-type transistor and a second P-type transistor,
wherein:
c) the first N-type transistor and the first P-type transistor, the gates of which are connected, are connected in series via a junction point between a first supply voltage line and a first ground line;
d) the second N-type transistor and the second P-type transistor, the gates of which are connected, are connected in series via a junction point between a second supply voltage line and a second ground line;
e) the junction point between the first N-type transistor and the first P-type transistor is connected to the gates of the second N-type transistor and the second P-type transistor; and
f) the junction point between the second N-type transistor and the second P-type transistor is connected to the gates of the first N-type transistor and the first P-type transistor;
g1) wherein a ground potential generating means is provided for adjusting a voltage potential difference between the first ground line and the second ground line; and
g2) wherein a supply potential generating means is provided for adjusting a voltage potential difference between the first supply voltage line and the second supply voltage line.

18. The latch unit according to claim 17, wherein the latch unit comprises first and second output drivers configured to drive first and second output lines.

19. A test circuit arrangement for testing latch units, comprising:
a) means for adjusting at least one of:
a1) a voltage potential difference between a first ground line and a second ground line of the latch units; and
a2) a voltage potential difference between a first supply voltage line and a second supply voltage line of the latch units;
b) means for combining logical outputs of the latch units; and
c) means for determining at least one of:
c1) the voltage potential difference between the first ground line and the second ground line; and
c2) the voltage potential difference between the first supply voltage line and the second supply voltage line in a state when all of the latch units have identical logical outputs.

* * * * *